United States Patent
Lee (12) 
(10) Patent No.: US 6,444,525 B1
(45) Date of Patent: Sep. 3, 2002

(54) METHOD FOR MANUFACTURING A NONVOLATILE MEMORY

(75) Inventor: Da Soon Lee, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/987,391

(22) Filed: Nov. 14, 2001

(30) Foreign Application Priority Data

Nov. 15, 2000 (KR) .......................................... P00-67718

(51) Int. Cl.$^7$ .......................................... H01L 21/8247
(52) U.S. Cl. ........................ 438/259; 438/291; 438/302
(58) Field of Search ................... 438/257–267, 438/289–291, 302

(56) References Cited

U.S. PATENT DOCUMENTS

| | | | | |
|---|---|---|---|---|
| 5,616,510 A | * | 4/1997 | Wong | 438/259 |
| 5,773,343 A | * | 6/1998 | Lee et al. | 438/259 |
| 6,093,606 A | * | 7/2000 | Lin et al. | 257/315 |
| 6,127,226 A | * | 10/2000 | Lin et al. | 438/259 |
| 6,239,465 B1 | * | 5/2001 | Nakagawa | 257/314 |
| 2001/0029077 A1 | * | 10/2001 | Noble et al. | 438/257 |

* cited by examiner

*Primary Examiner*—Richard Booth
(74) *Attorney, Agent, or Firm*—Morgan, Lewis & Bockius LLP

(57) ABSTRACT

A method for manufacturing a nonvolatile memory includes steps of forming a first trench of a first width in a substrate of a first conductivity type, forming a second trench within the first trench, having a second width smaller than the first width of the first trench, injecting ions into a surface of the substrate and into sidewalls of the first and second trenches to adjust a threshold voltage, forming first insulating film sidewalls on the sidewalls of the first and second trenches, forming source and drain regions by injecting second conductive impurity ions into the substrate and bottom surfaces of the first and second trenches, depositing a second insulating film on the substrate, forming a floating gate and a gate electrode on sidewalls of the second insulating film within the first and second trenches, depositing a third insulating film on the substrate, and forming a control gate on sidewalls of the third insulating film at a sidewall of the first trench.

11 Claims, 9 Drawing Sheets

FIG. 1
Related Art operational

| Mode | Vsource | Vdrain | Vcontrol gate | Vselect gate |
|---|---|---|---|---|
| Program | 0 | ~ 5V | ~ 12V | ~ 2V |
| Erase | 0 | ~ 5V | ~ -11V | 0 |
| Read | 0 | ~ 5V | ~ 5V | ~ 5V |

METHOD FOR MANUFACTURING A NONVOLATILE MEMORY

The present invention claims the benefit of Korean Patent Application No. P2000-67718 filed in Korea on Nov. 15, 2000, which is hereby incorporated by reference.

BACKGROUND OF THE INVENTION

Field of the Invention

The present invention relates to a method for manufacturing a semiconductor memory, and more particularly, to a method for manufacturing a nonvolatile memory.

Background of the Related Art

In general, semiconductor memories, such as a static random access memory (SRAM), a dynamic random access memory (DRAM), and a read only memory (RAM), for example, have been widely used. The DRAM is most widely used due to the spread of personal computers. The DRAM commands more than 80% of the semiconductor memory market.

Presently, nonvolatile memories have begun to substitute for DRAM memories. In several years, nonvolatile memories, such as flash and electrically erasable programmable ROM (EEPROM), for example, may substitute for the DRAM memory. However, in a related art nonvolatile memory technology, an area of the nonvolatile memory is increased when a select gate is selected considering a size of a memory cell. Therefore, only a few ranking semiconductor corporations can mass-manufacture the nonvolatile memory due to sophisticated manufacturing process steps. Accordingly, it is most important to minimize the size of the nonvolatile memory and to simplify the manufacturing process steps.

SUMMARY OF THE INVENTION

Accordingly, the present invention is directed to a method for manufacturing a nonvolatile memory that substantially obviates one or more problems due to limitations and disadvantages of the related art.

An object of the present invention is to provide a method for manufacturing a vertical nonvolatile memory having two trenches to minimize size.

Another object of the present invention is provide a method for manufacturing a nonvolatile memory using a reduced number of masks, thereby simplifying manufacturing processing.

Additional features and advantages of the invention will be set forth in the description which follows, and in part will apparent from the description, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a nonvolatile memory includes forming a first trench of a first width in a substrate of a first conductivity type, forming a second trench within the first trench, having a second width smaller than the first width of the first trench, injecting ions into a surface of the substrate and into sidewalls of the first and second trenches to adjust a threshold voltage, forming first insulating film sidewalls on the sidewalls of the first and second trenches, forming source and drain regions by injecting second conductive impurity ions into the substrate and bottom surfaces of the first and second trenches, depositing a second insulating film on the substrate, forming a floating gate and a gate electrode on sidewalls of the second insulating film within the first and second trenches, depositing a third insulating film on the substrate, and forming a control gate on sidewalls of the third insulating film at a sidewall of the first trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 2A to 2O are cross sectional views showing exemplary manufacturing process steps of a nonvolatile memory according to the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
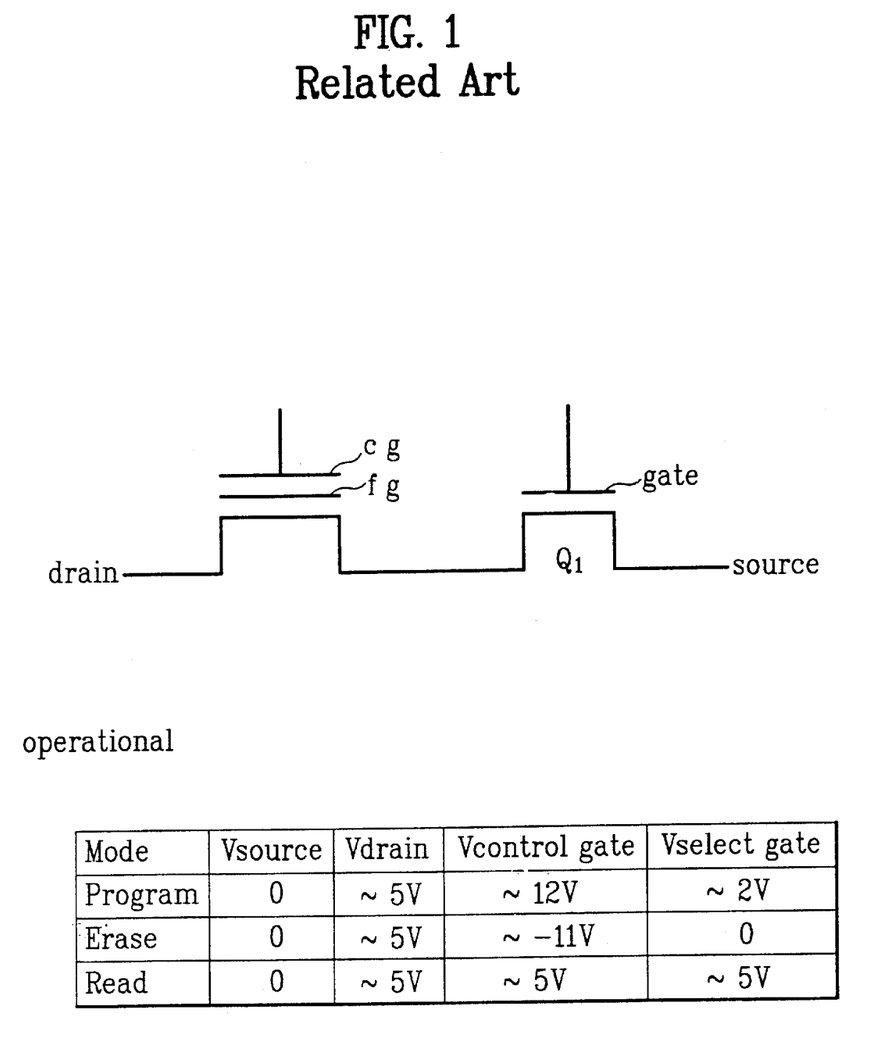
FIG. 1 illustrates a circuit diagram and an operation characteristic table of a general nonvolatile memory according to a related art.

FIG. 1 illustrates a circuit diagram of a nonvolatile memory according to a related art and a table showing voltages applied according to operation of each mode. In FIG. 1, a nonvolatile memory cell includes a select transistor Q1 and an EPROM that includes a floating gate fg and a control gate cg, wherein the select transistor Q1 selects the nonvolatile memory cell.

To program data in the nonvolatile memory cell, a voltage of 0V is applied to a source terminal of the nonvolatile memory, a voltage of 5V is applied to a drain terminal, a voltage of 12V is applied to the control gate cg of the EPPROM, and a voltage of 2V is applied to a GATE of the select transistor Q1. Electric charge tunnels through to the floating gate fg according to the voltage applied to the drain terminal, and is stored in the floating gate fg. Accordingly, data 1 or 0 is programmed according to the electric charge of the floating gate fg.

To erase the data stored in the EEPROM, a voltage of 0V is applied to the source terminal, a voltage of 5V is applied to the drain terminal, a voltage of 11V is applied to the control gate cg of the EEPROM, and a voltage of 0V is applied to the GATE of the select transistor. Therefore, the electric charge stored in the floating gate fg is discharged.

To read the programmed data, a voltage of 0V is applied to the source terminal, a voltage of 2V is applied to the drain terminal, a voltage of 5V is applied to the control gate cg of the EEPROM, a voltage of 5V is applied to the GATE of the select transistor, so that data 1 or 0 is read according to the electric charge stored in the floating gate fg of the EPPROM.

Figure 2A:
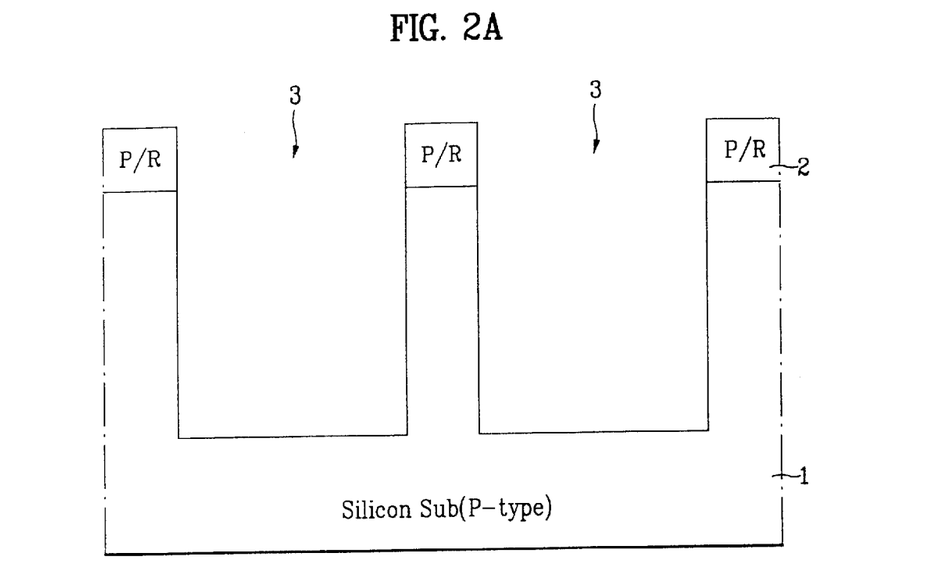

FIGS. 2A to 2O illustrate exemplary manufacturing process steps of the nonvolatile memory according to the present invention.

In FIG. 2A, a first photoresist 2 may be deposited on a p-type silicon substrate 1, and partially removed by photolithographic processing, for example, to form a first trench 3.

Figure 2B:
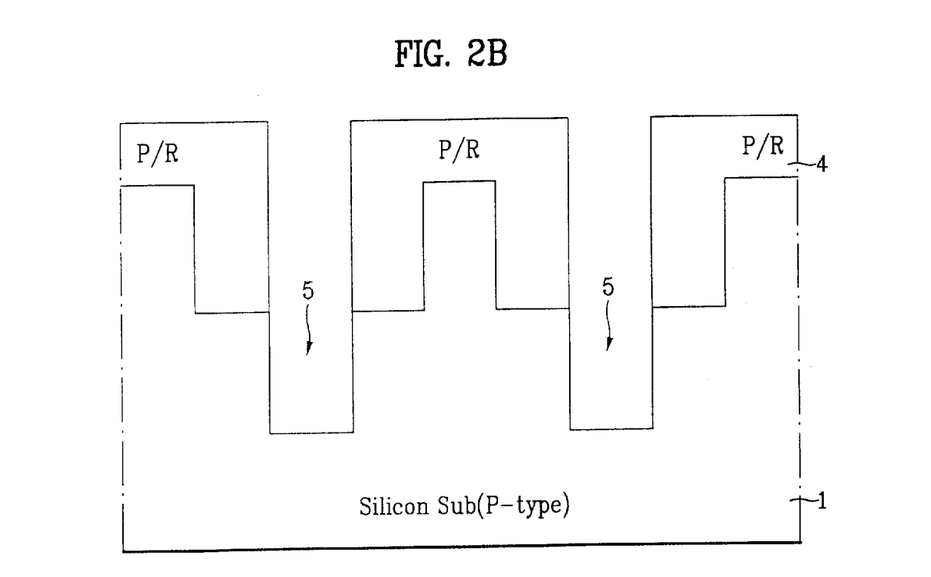

In FIG. 2B, the first photoresist 2 is removed, and a second photoresist 4 may be deposited on an entire surface of the p-type silicon substrate 1. Then, exposure and developing processes may be performed to expose a bottom surface of the first trench 3. Subsequently, the bottom surface of the first trench 3 is partially removed, thereby forming a second trench 5 within the first trench, wherein the second trench 5 may be narrower than the first trench 3.

Figure 2C:
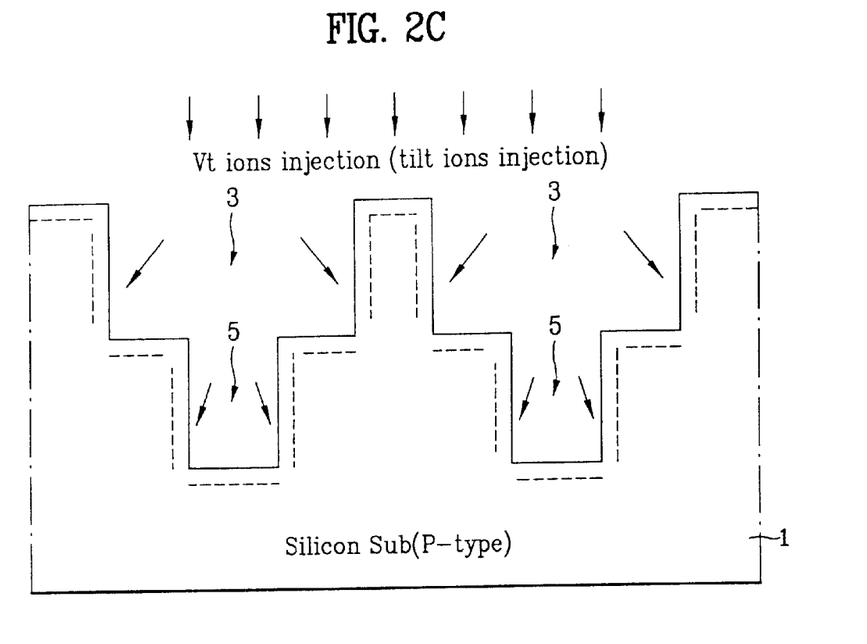

In FIG. 2C, the second photoresist 4 may be removed, and p-type and/or n-type ions may be injected, for example, into surfaces of the first and second trenches 3 and 5 to control a threshold voltage.

Figure 2D:
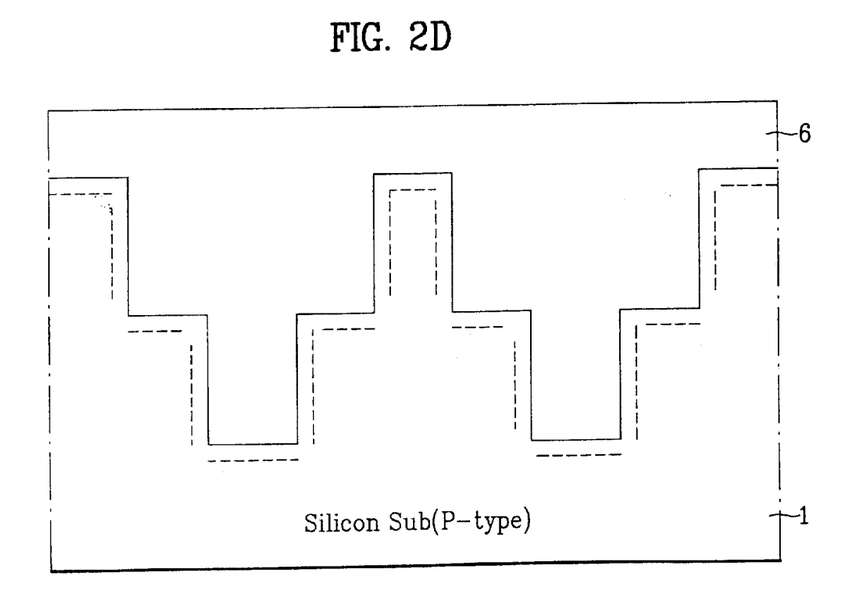

In FIG. 2D, a first oxide film 6 may be deposited, for example, on the entire surface of the p-type silicon substrate to fill the first and second trenches 3 and 5.

Figure 2E:
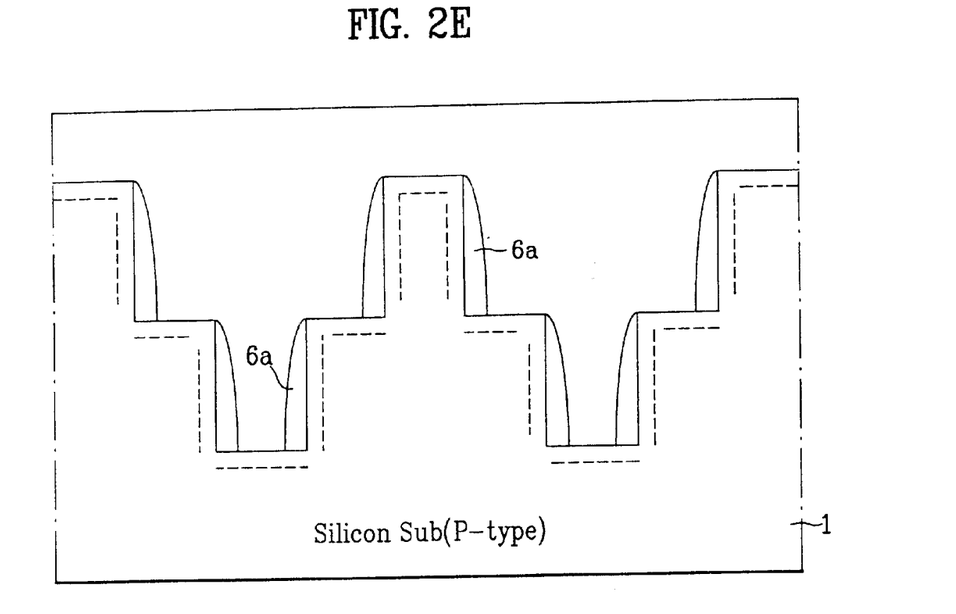

In FIG. 2E, the first oxide film 6 may be removed by an anisotropic etching process, for example, thereby forming sidewall oxide films 6a at sidewalls of the first and second trenches 3 and 5.

Figure 2F:
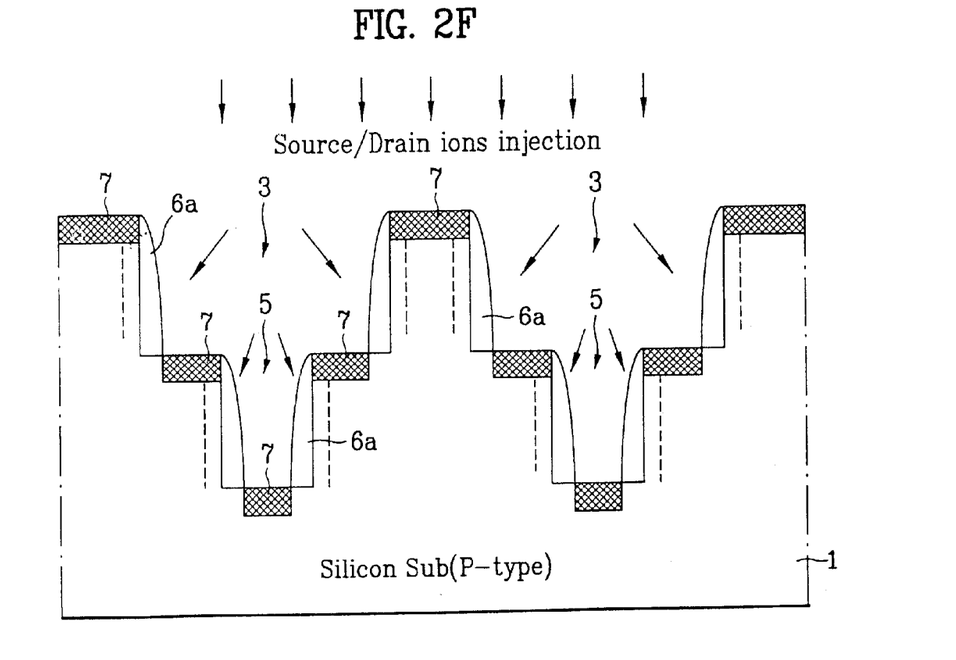

In FIG. 2F, n-type impurity ions may be injected, for example, into surfaces of the exposed substrate and bottom surfaces of the first and second trenches 3 and 5, thereby forming source and drain regions 7. The n-type impurity ions may not be injected into the sidewall oxide films 6a, and may be partially injected into the exposed portion from the sidewall oxide films 6a.

Figure 2G:
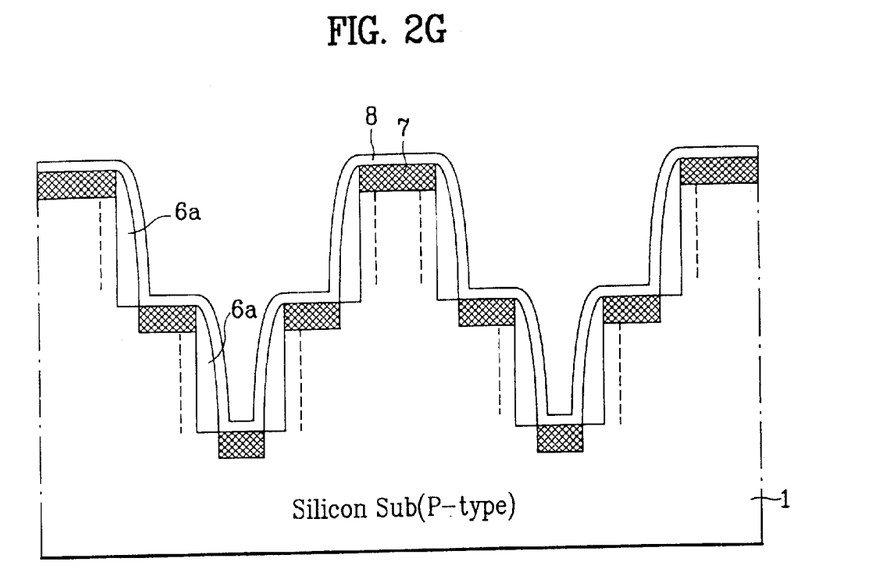

In FIG. 2G, a second oxide film 8, functioning as a gate insulating film, may be deposited, for example, on the entire surface of the substrate including the source and drain regions 7.

Figure 2H:
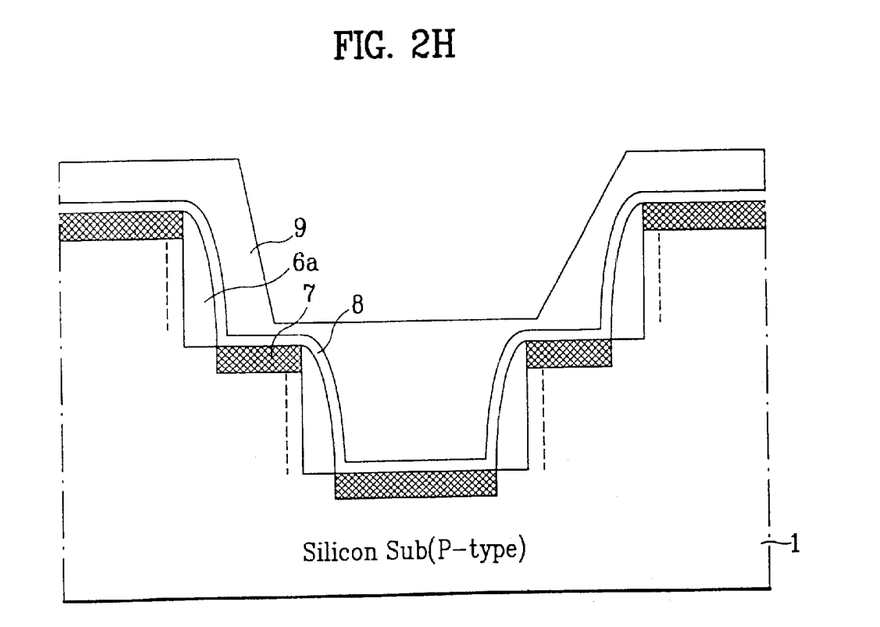

In FIG. 2H, a first polysilicon film 9 may be formed on the second oxide film 8. The first polysilicon film 9 may be deposited, for example, to fill the second trench 5 using flow characteristic of the first polysilicon film 9. After depositing the first polysilicon film 9, $POCL_3$ processing or ion injection, for example, may be performed on the substrate, thereby adjusting resistance of the polysilicon film 9.

Figure 2I:
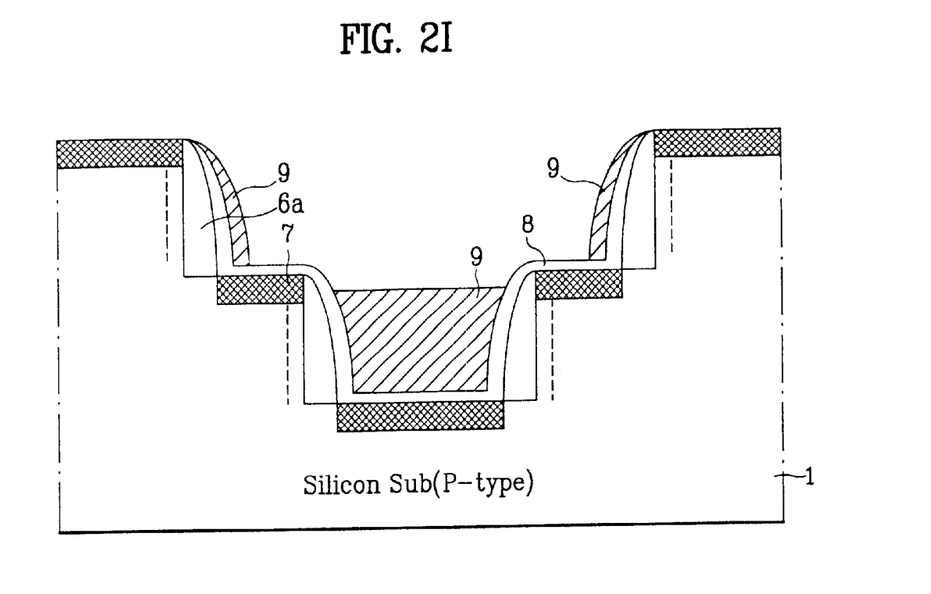

In FIG. 2I, the first polysilicon film 9 may be etched, for example, to form portion on sidewalls of the first trench 3 and within the second trench 5.

Figure 2J:
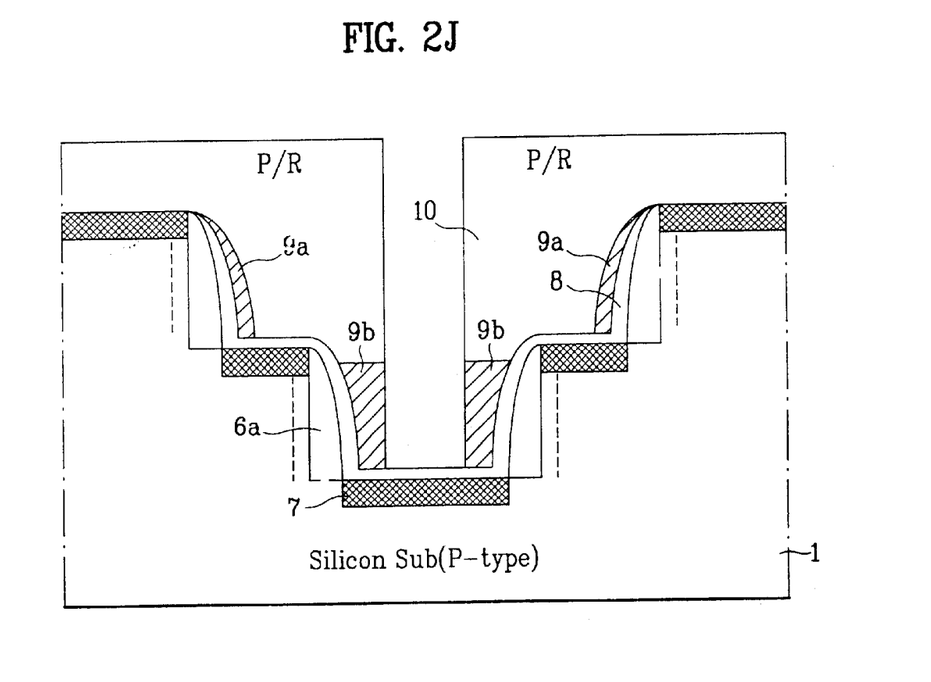

In FIG. 2J, the first polysilicon film 9 formed within the second trench 5 may be selectively removed to form portions on both sidewalls of the second trench 5, thereby respectively forming a floating gate 9a of the EEPROM, and a gate 9b of a select transistor. Accordingly, the floating gate 9a is formed at the sidewall of the first trench 3, and the gate 9b of the select transistor may be formed at the sidewall of the second trench 5.

Figure 2K:
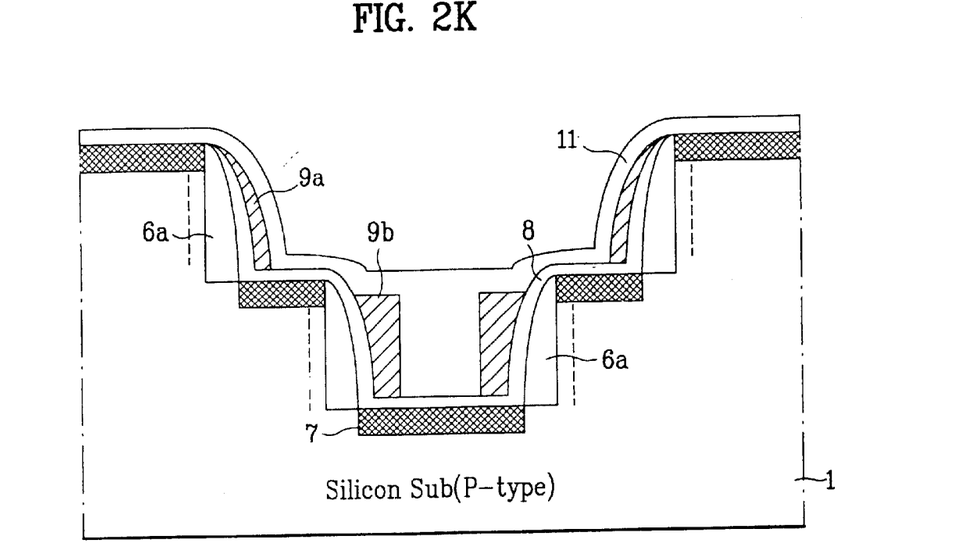

In FIG. 2K, a third oxide film 11 may be formed on the entire surface of the substrate 1 to fill the second trench 5. Accordingly, the third oxide film 11 may serve as an insulating interlayer between the floating gate 9a and a control gate.

Figure 2L:
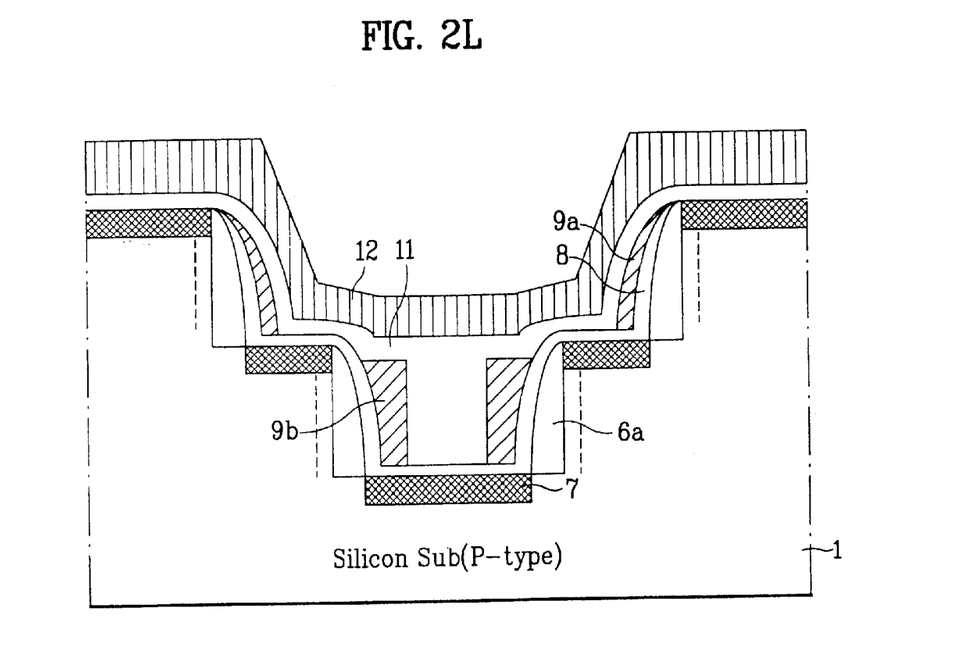

In FIG. 2L, a second polysilicon film 12 may be deposited, for example, on the entire surface of the substrate 1.

Figure 2M:
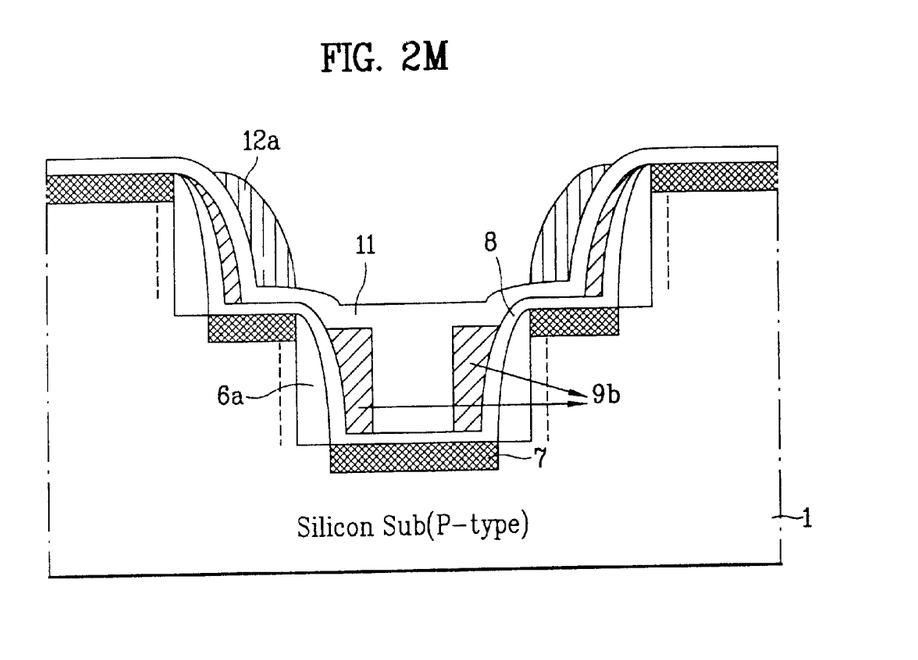

In FIG. 2M, the second polysilicon film 12 may be etched, for example, thereby forming a control gate 12a of the EPPROM at the sidewalls of the first trench 3. After depositing the second polysilicon film 12, $POCL_3$ processing or ion injection, for example, may be performed, thereby adjusting a resistance of the second polysilicon film 12.

Figure 2N:
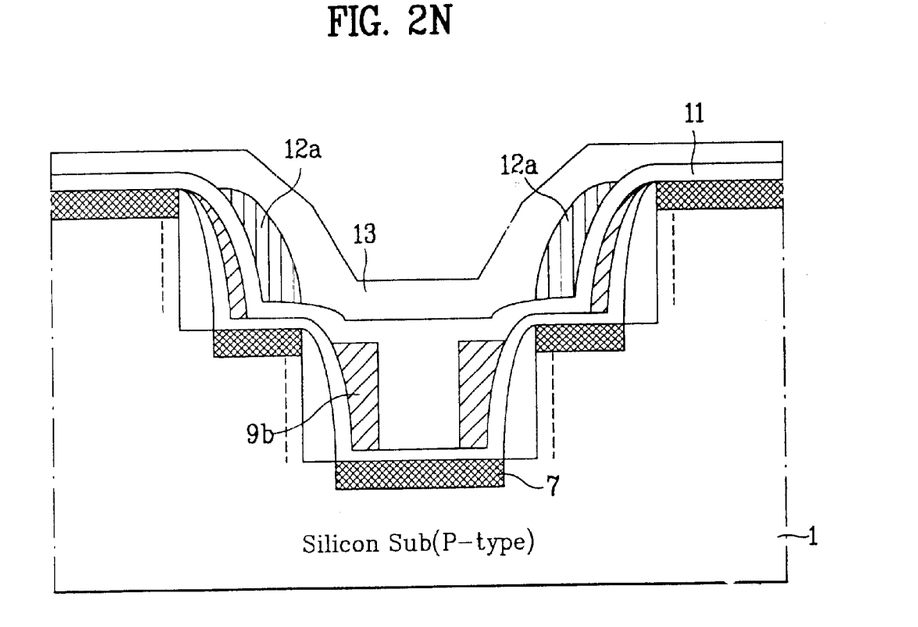

In FIG. 2N, a fourth oxide film 13 may be deposited, for example, on the entire surface of the substrate 1.

In FIG. 2O, the second, third and fourth oxide films 8, 11 and 13 may be selectively removed to expose the source and drain regions 7 that are formed in the bottom surface of the second trench 5, thereby forming a contact hole. Then, a metal plug 14, for example, may be formed in the contact hole, thereby completing the nonvolatile memory of the present invention.

It will be apparent to those skilled in the art that various modifications and variations can be made in the method for manufacturing a nonvolatile memory of the present invention without departing from the spirit or scope of the invention. Thus, it is intended that the present invention cover the modifications and variations of this invention provided they come within the scope of the appended claims and their equivalents.

What is claimed is:

1. A method for manufacturing a nonvolatile memory comprising the steps of:

forming a first trench of a first width in a substrate of a first conductivity type;

forming a second trench within the first trench, having a second width smaller than the first width of the first trench;

injecting ions into a surface of the substrate and into sidewalls of the first and second trenches to adjust a threshold voltage;

forming first insulating film sidewalls on the sidewalls of the first and second trenches;

forming source and drain regions by injecting second conductive impurity ions into the substrate and bottom surfaces of the first and second trenches;

depositing a second insulating film on the substrate;

forming a floating gate and a gate electrode on sidewalls of the second insulating film within the first and second trenches;

depositing a third insulating film on the substrate; and forming a control gate on sidewalls of the third insulating film at a sidewall of the first trench.

2. The method according to claim 1, wherein the step of injecting ions into a surface of the substrate and into sidewalls of the first and second trenches includes tilt ion implantation.

3. The method according to claim 1, wherein the step of forming the floating gate and the gate electrode includes the steps of forming a conductive film on the second insulating film, and patterning the conductive film to remain only on the second insulating film within the first and second trenches.

4. The method according to claim 3, further comprising the step of adjusting a resistance of the conductive film after forming the conductive film using one of injecting ions and $POCL_3$ processing.

5. The method according to claim 3, wherein the conductive film is formed of polysilicon.

6. The method according to claim 1, wherein the third insulating film is formed to fill the second trench.

7. The method according to claim 1, further comprising the steps of:

depositing a fourth insulating film on the substrate;

forming a contact hole by selectively removing the second, third, and fourth insulating films to expose the source and drain regions formed on the bottom surface of the second trench; and forming a metal plug in the contact hole.

8. The method according to claim 7, wherein the fourth insulating film is formed of an oxide film.

9. The method according to claim 1, wherein the first insulating film, the second insulating film and the third insulating film are formed of an oxide film.

10. The method according to claim 1, wherein the control gate is formed by depositing a polysilicon film, and etching the polysilicon film to remain only on the sidewalls of the third insulating film.

11. The method according to claim 10, further comprising the step of adjusting a resistance of the polysilicon film by one of $POCL_3$ processing and ion injection after the step of depositing the polysilicon film.

* * * * *